(12) United States Patent
Mongia et al.

(10) Patent No.: US 7,764,514 B2
(45) Date of Patent: Jul. 27, 2010

(54) ELECTROMAGNETIC INTERFERENCE SHIELDING FOR DEVICE COOLING

(75) Inventors: Rajiv K. Mongia, Fremont, CA (US); Anandaroop Bhattacharya, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/890,613

(22) Filed: Aug. 6, 2007

(65) Prior Publication Data

US 2008/0137291 A1 Jun. 12, 2008

(30) Foreign Application Priority Data

Dec. 8, 2006 (IN) .................. 2630/DEL/2006

(51) Int. Cl.
*H05K 9/00* (2006.01)
*H05K 7/20* (2006.01)

(52) U.S. Cl. .............. 361/818; 361/690; 361/816; 174/382

(58) Field of Classification Search ......... 174/377–385; 361/818
See application file for complete search history.

(56) References Cited

U.S. PATENT DOCUMENTS

| | | | |
|---|---|---|---|
| 4,897,762 A | | 1/1990 | Daikoku et al. |
| 5,063,476 A | | 11/1991 | Hamadah et al. |
| 5,285,350 A | | 2/1994 | Villaume |
| 5,313,362 A | | 5/1994 | Hatada et al. |
| 5,331,508 A | * | 7/1994 | Hosoi et al. ............. 361/680 |
| 5,519,585 A | * | 5/1996 | Jones et al. ............. 361/818 |
| 5,563,768 A | | 10/1996 | Perdue |
| 5,694,294 A | | 12/1997 | Ohashi et al. |
| 5,953,206 A | | 9/1999 | Jondrow |
| 6,005,770 A | | 12/1999 | Schmitt |
| 6,175,495 B1 | | 1/2001 | Batchelder |
| 6,181,557 B1 | | 1/2001 | Gatti |
| 6,226,180 B1 | | 5/2001 | Ueda et al. |
| 6,226,182 B1 | * | 5/2001 | Maehara ............. 361/695 |
| 6,229,701 B1 | | 5/2001 | Kung et al. |
| 6,252,160 B1 | * | 6/2001 | Chang et al. ............. 174/382 |
| 6,259,601 B1 | | 7/2001 | Jaggers et al. |
| 6,336,691 B1 | | 1/2002 | Maroney et al. |
| 6,348,653 B1 | * | 2/2002 | Cho ............. 174/383 |
| 6,385,043 B1 | | 5/2002 | Ueda et al. |
| 6,421,238 B1 | | 7/2002 | Negishi |

(Continued)

FOREIGN PATENT DOCUMENTS

DE 20 2004 003310 U 8/2004

OTHER PUBLICATIONS

Unknown, "Streetwise: Power Support -4C Vent Laptop Cooling Stand 17", web document, www.streetwise.com.au, Mar. 27, 2003, 2 pages + 1 illustration.

(Continued)

*Primary Examiner*—Gregory D Thompson
(74) *Attorney, Agent, or Firm*—Blakely, Sokoloff, Taylor & Zafman LLP

(57) ABSTRACT

Embodiments disclosed herein include EMI shielding to cool a computing device with one or more vents. In some embodiments, a louvered vent formed in the EMI shield of a computing device creates an air curtain between the EMI shield and a heat-generating component to cool the component, the EMI shield and the external wall. Other embodiments are described.

17 Claims, 4 Drawing Sheets

U.S. PATENT DOCUMENTS

| | | | |
|---|---|---|---|
| 6,459,573 | B1 | 10/2002 | DiStefano et al. |
| 6,477,502 | B1 | 6/2003 | DiStefano et al. |
| 6,577,502 | B1 | 6/2003 | DiStefano et al. |
| 6,588,497 | B1 | 7/2003 | Glezer et al. |
| 6,678,157 | B1 | 1/2004 | Bestwick |
| 6,724,624 | B1 | 4/2004 | Dodson |
| 6,765,796 | B2 | 7/2004 | Hoffman et al. |
| 6,801,430 | B1 | 10/2004 | Pokharna |
| 6,947,294 | B2 | 9/2005 | Lin et al. |
| 7,031,154 | B2 | 4/2006 | Bash et al. |
| 7,173,822 | B2 * | 2/2007 | Liang et al. .................. 361/695 |
| 7,201,651 | B2 | 4/2007 | Su |
| 7,210,946 | B2 * | 5/2007 | Chen ........................... 439/92 |
| 7,248,471 | B2 | 7/2007 | Wabiszczewicz |
| 7,251,139 | B2 | 7/2007 | Bhattacharya et al. |
| 7,310,227 | B2 | 12/2007 | Kusamoto et al. |
| 7,403,385 | B2 | 7/2008 | Boone et al. |
| 7,416,481 | B2 | 8/2008 | Baker et al. |
| 2003/0121645 | A1 | 7/2003 | Wang |
| 2003/0156385 | A1 | 8/2003 | Askeland et al. |
| 2003/0210523 | A1 * | 11/2003 | Tuttle et al. ................. 361/687 |
| 2004/0217072 | A1 | 11/2004 | Bash et al. |
| 2005/0013116 | A1 | 1/2005 | Pokharna et al. |
| 2005/0207113 | A1 | 9/2005 | Tanaka |
| 2006/0133036 | A1 | 6/2006 | Durney |
| 2007/0064388 | A1 * | 3/2007 | Uchizono et al. ........... 361/690 |
| 2007/0076370 | A1 | 4/2007 | Mongia et al. |
| 2008/0117590 | A1 | 5/2008 | Deu et al. |
| 2009/0168332 | A1 | 7/2009 | Mongia |

OTHER PUBLICATIONS

Unknown, "Top 9 Laptop Computer Safety Tips", web document, Laptop Computer Safety, Copyright 2005, 3 pages total.

Guarino, John et al., "Characterization of Laminar Jet Implingment Cooling in Portable Computer Apps" IEEE Transaction of Components & Packaging Tech IEEE SVC CTR, Piscataway, NJ, US, vol. 25, No. 3, Sep. 2002 pp. 337-346.

Vader et al. "Nozzle for Enhanced Impingement Cooling" IP.COM Journal, IP.COM Inc., West Henrietta, NY, US, Aug. 1, 1991, No. of pp. 3.

Int'l Search Report and Written Opinion of the International Searching Authority for PCT No. PCT/US2006/377759, mailed Nov. 8, 2007.

* cited by examiner

ELECTROMAGNETIC INTERFERENCE SHIELDING FOR DEVICE COOLING

CROSS-REFERENCE TO RELATED APPLICATIONS

This application claims priority to Indian Patent Application number 2630/Del/2006, entitled ELECTROMAGNETIC INTERFERENCE SHIELDING FOR DEVICE COOLING, filed on Dec. 8, 2006.

This application includes related subject matter to application Ser. No. 11/244,496, entitled "Apparatus and Method to Efficiently Cool a Computing Device", and filed Sep. 30, 2005.

FIELD OF INVENTION

The invention relates to the field of thermal management of devices, and in particular the cooling of heat generating components using electromagnetic interference shielding.

BACKGROUND

Thermal management can be critical in many applications. Excessive heat can cause damage to or degrade the performance of mechanical, chemical, electric, and other types of devices. Thermal management becomes more critical as technology advances and newer devices continue to become smaller and more complex, and as a result run at higher power levels and/or power densities.

Modern devices often include various electronic circuits or components, each of which may be capable of generating heat or thermal energy. As these components are often critical to the operation of the device, inadequate cooling can result in system crashes, lockups, surprise reboots, and other errors. The risk of such problems can become especially acute in the tight confines found inside devices, such as computing devices, personal computers, servers and other computing and electronic devices with a high density of components.

Prior methods for dealing with such cooling problems have included using vent systems in the walls of a device. As the amount of cooling air available within computing device is reduced as the device is scaled down, alternative approaches are advantageous due to the confined space and reduced weight.

BRIEF DESCRIPTION OF THE DRAWINGS

Various advantages of embodiments of the invention will become apparent to one skilled in the art by reading the following specification and appended claims, and by referencing the following drawings, in which:

DETAILED DESCRIPTION

Described herein are methods and devices to decrease the temperatures of the electromagnetic interference (EMI) shielding, and thus of the external walls of computing devices and of the electronic components within the computing devices. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to highlight some embodiments of the invention.

Figure 1A:
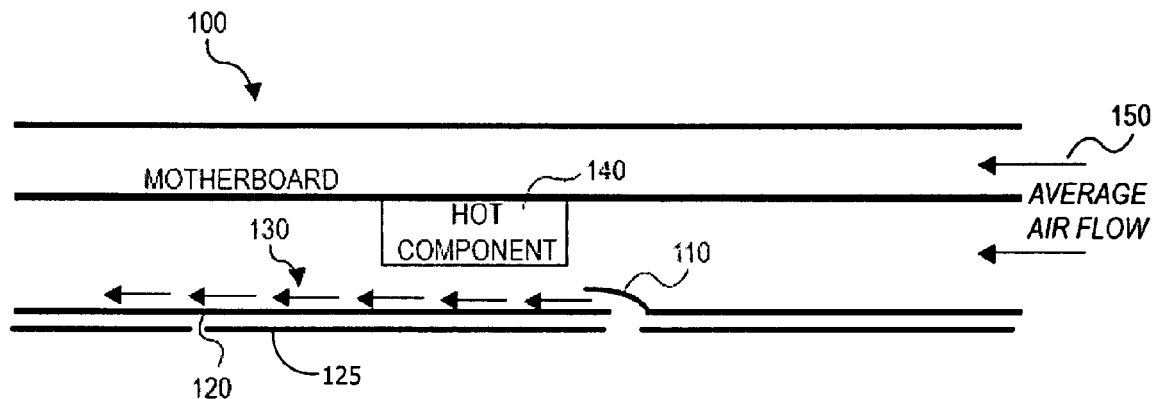
FIG. 1A illustrates an embodiment of a cross-sectional view of an electromagnetic interference (EMI) shield with a louvered vent according to some embodiments of the invention.
Figure 1B:
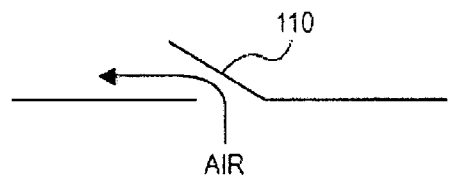
FIGS. 1B-1D illustrate cross-sectional views of different shapes of the louvered vent according to some embodiments of the invention.
Figure 1C:
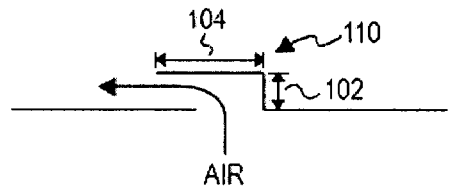
Figure 1D:
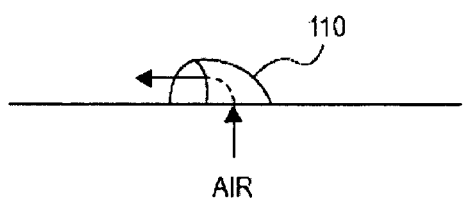

FIG. 1A illustrates an embodiment of a louvered vent 110 that has been formed within the EMI shield 120 of a computing device 100 to form an air curtain 130 between the EMI shield 120 and an electronic component 140 to cool the EMI shield 120 as well as an external wall 125, according to some embodiments of the invention. An air curtain 130 is a thin film of air that may be formed along the inside of the EMI shield 120. The air curtain 130 may be formed inside the computing device 100 to supplement the average airflow 150 available on the inside of the computing device 100. The air curtain 130 is formed by the fluid dynamics of the louvered vent 110. The purpose of the air curtain 130 is to isolate the EMI shield 120 and the external wall 125 from the heat generating components 140. The shape of the louvered vent 110 may be designed to redirect the flow of the air coming into the computing device 100 from outside of the EMI shield 120. The louvered vent 110 illustrated in FIG. 1A is a curved louvered vent 110. FIGS. 1B, 1C and 1D illustrate alternative embodiments of the shape of the louvered vent 110.

In FIG. 1B an angled louvered vent 110 is illustrated according to some embodiments of the invention. The angled louvered vent 110 of FIG. 1B may have any angle with respect to the EMI shield 120 that is sufficient to form a curtain of cooling air 130, but more particularly may have an angle with respect to the EMI shield 120 in the approximate range of 15 degrees and 45 degrees.

FIG. 1C illustrates a squared of chamber louvered vent 110 according to some embodiments of the invention. The height 102 of the squared off chamber may vary depending on the dimensions of the interior of the computing device 100, but in one particular embodiment where the computing device 100 is a laptop computer, the height 102 of the squared off chamber may be in the approximate range of 1 millimeter (mm)-3 mm. The length 104 of the squared off chamber louvered vent 110 may be any length sufficient to form the air curtain 130 along the EMI shield 120.

FIG. 1D illustrates a hooded louvered vent 110. The hooded louvered vent 110 may be curved, angled, or squared and forms an enclosed louvered vent 110 to more specifically focus the air curtain 130. The hooded louvered vent 110 may have a width and a height sufficient to create an air curtain 130 that is capable of reducing the temperature of the EMI shield 120.

Figure 2:
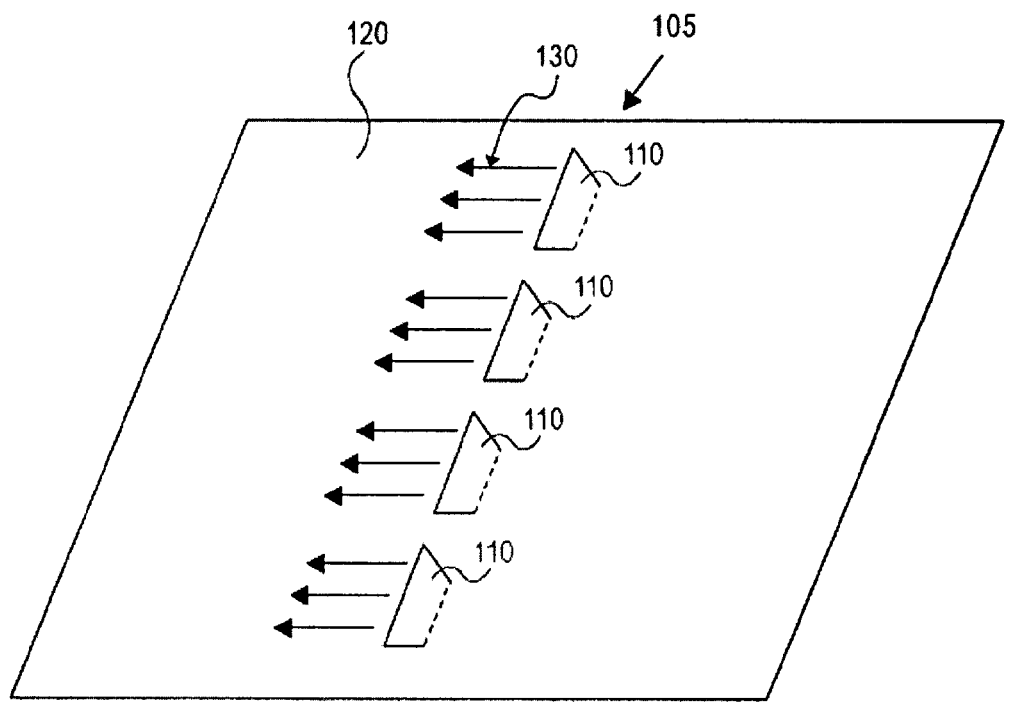
FIG. 2 illustrates an overhead view of the surface of an EMI shield with a row of louvered vents according to some embodiments of the invention.
Figure 3:
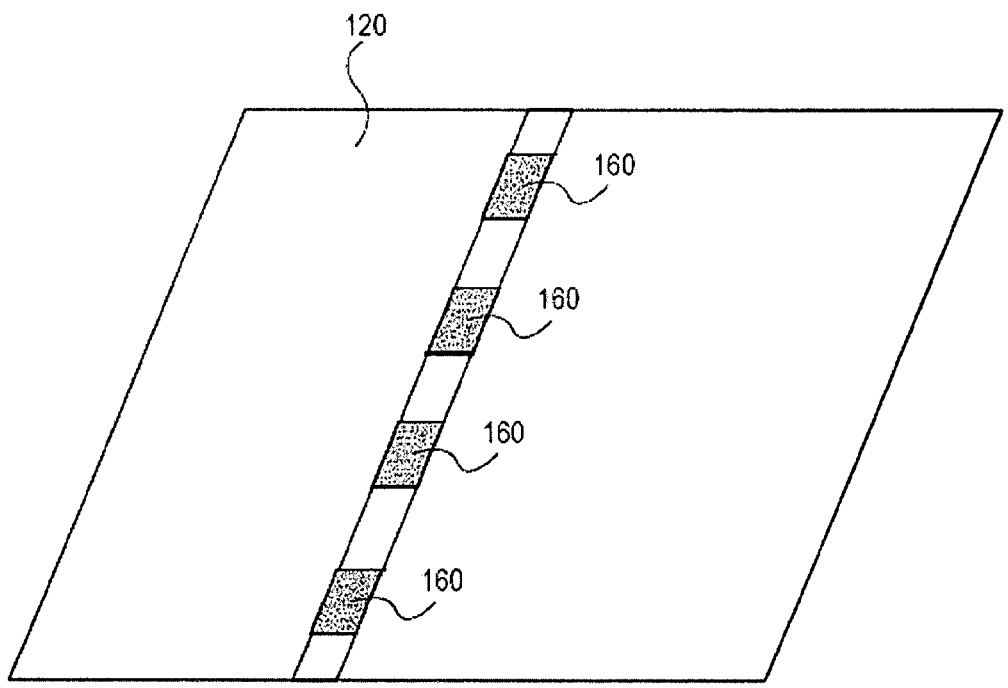
FIG. 3 illustrates an overhead view of the EMI shield with a row of louvered vents according to some embodiments of the invention.

FIGS. 2 and 3 illustrate some embodiments of angled louvered vents 110 formed in a row 105 in an EMI shield 120 of a computing device 100. FIG. 2 illustrates a top view of the inside surface of the EMI shield 120 according to some embodiments of the invention. The row 105 of louvered vents 110 may be used to form many air curtains 130 along the inside surface of the EMI shield 120. The multiple air curtains 130 may in effect form a continuous air curtain 130. FIG. 3 illustrates a bottom view of the outside surface of the EMI shield 120 to illustrate the openings 160 of the louvered vents 110. In some embodiments, not shown, a louvered vent 110 may be formed that crosses a substantial width or length of the EMI shield 120. Many variations of length, width, and positioning of the louvered vents 110 may be used depending on the placement of the heat generating components 140 within the mobile computing device and depending on how many air curtains are sufficient to cool the EMI shield 120.

Figure 4:
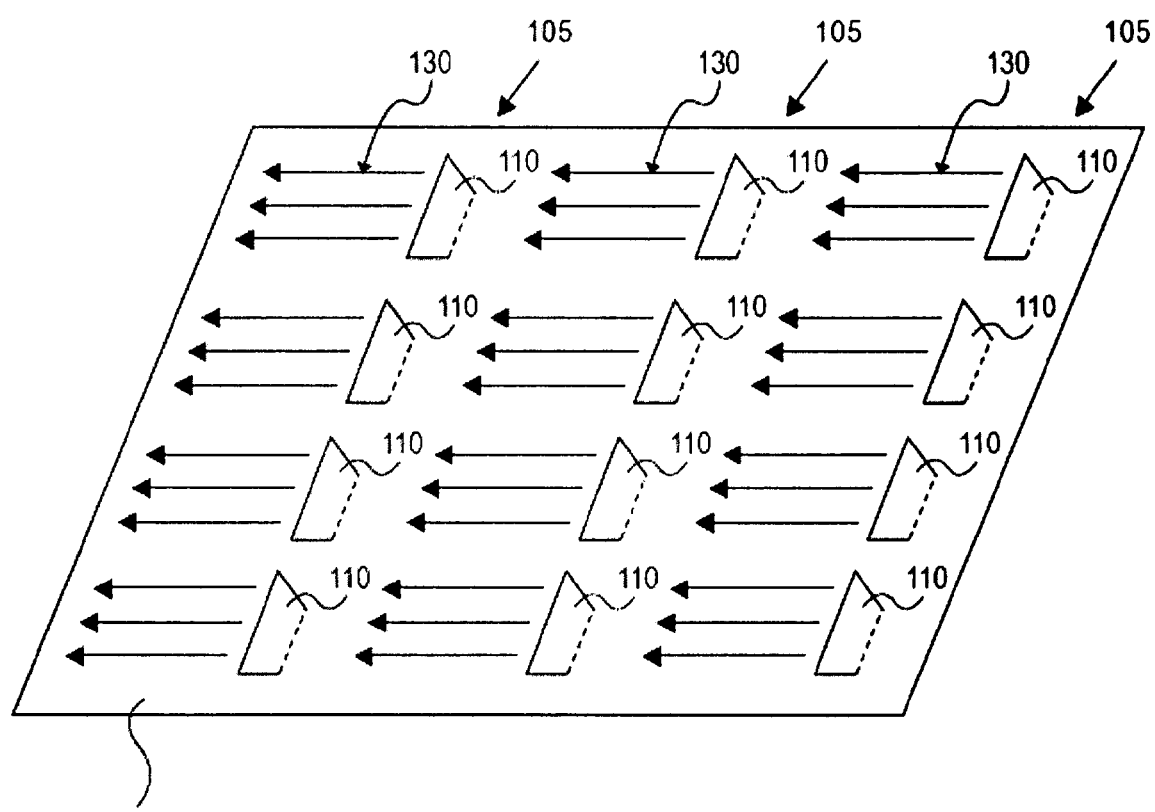
FIG. 4 illustrates a series of rows of vents in the EMI shield, according to some embodiments of the invention.

FIG. 4 illustrates an embodiment where a series of rows 105 of louvered vents 110 are positioned to create an air curtain formed of the combined series of air curtains 130 over substantially the entire EMI shield 120. The rows 105 of the louvered vents may be positioned approximately 10 mm-30 mm apart. The distance between the rows 105 of louvered vents 110 is determined by the distance at which the air curtain begins to break up so that the next row 105 of louvered vents 110 can take over to form an air curtain over the EMI shield 120 to cool the EMI shield 120.

In an embodiment, the positioning of the louvered vents 110 may be determined by the placement of the heat generating components within the computing device 100. In this embodiment, the louvered vents 110 may be positioned to one side of the heat generating components 140 so that an air curtain 130 is formed substantially beneath the electronic components 140 as illustrated in FIG. 1A. The louvered vents 110 described in these embodiments may decrease the temperature of the EMI shield 120 by approximately 20%-25% or more. The amount by which the temperature of the EMI shield 120 is decreased may vary depending on the type of louvered vent 110, the number of louvered vents 110, and the positioning of the louvered vents 110. In some embodiments, one or more vents may be formed in a manifold rather than in rows as one of ordinary skill in the relevant art would appreciate based at least on the teachings provided herein.

The louvered vents 110 may be formed within the EMI shield 120 by machining, stamping, or molding, for example. The louvered vents 110 may be formed of any material such as plastic polymers or metal. In one embodiment, the louvered vents 110 are formed from the EMI shield and provide electromagnetic interference (EMI) protection.

Figure 5:
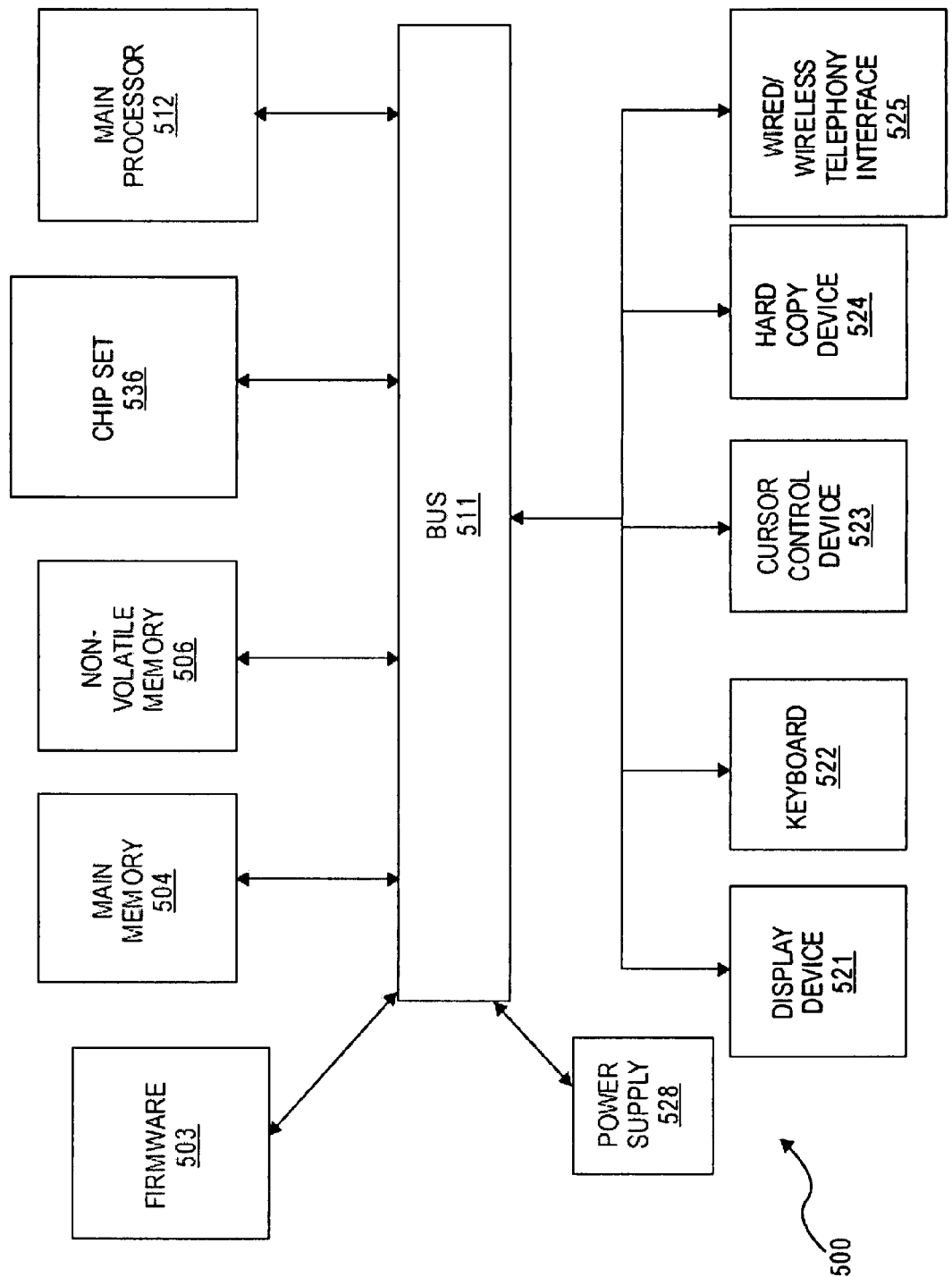
FIG. 5 illustrates of a computing device system that may employ embodiments of the EMI shield with vents according to some embodiments of the invention.

FIG. 5 illustrates a block diagram of an example computer system that may use an embodiment of the louvered vents 110 or nozzle vents 310 to cool the external walls or heat generating components of a mobile computing device. In one embodiment, computer system 500 comprises a communication mechanism or bus 511 for communicating information, and an integrated circuit component such as a processor 512 coupled with bus 511 for processing information. One or more of the heat generating components or devices in the computer system 500 such as the processor 512 or a chip set 536 may be cooled by an embodiment of the nozzle vents 310 in combination with the louvered vents 110 to cool the external walls of the mobile computing device.

Computer system 500 further comprises a random access memory (RAM) or other dynamic storage device 504 (referred to as main memory) coupled to bus 511 for storing information and instructions to be executed by processor 512. Main memory 504 also may be used for storing temporary variables or other intermediate information during execution of instructions by processor 512.

Firmware 503 may be a combination of software and hardware, such as Electronically Programmable Read-Only Memory (EPROM) that has the operations for the routine recorded on the EPROM. The firmware 503 may embed foundation code, basic input/output system code (BIOS), or other similar code. The firmware 503 may make it possible for the computer system 400 to boot itself.

Computer system 500 also comprises a read-only memory (ROM) and/or other static storage device 506 coupled to bus 511 for storing static information and instructions for processor 512. The static storage device 506 may store OS level and application level software.

Computer system 400 may further be coupled to a display device 521, such as a cathode ray tube (CRT) or liquid crystal display (LCD), coupled to bus 511 for displaying information to a computer user. A chipset, such as chipset 536, may interface with the display device 521.

An alphanumeric input device (keyboard) 522, including alphanumeric and other keys, may also be coupled to bus 511 for communicating information and command selections to processor 512. An additional user input device is cursor control device 523, such as a mouse, trackball, trackpad, stylus, or cursor direction keys, coupled to bus 511 for communicating direction information and command selections to processor 512, and for controlling cursor movement on a display device 512. A chipset, such as chip set 536, may interface with the input output devices.

Another device that may be coupled to bus 511 is a hard copy device 524, which may be used for printing instructions, data, or other information on a medium such as paper, film, or similar types of media. Furthermore, a sound recording and playback device, such as a speaker and/or microphone (not shown) may optionally be coupled to bus 511 for audio interfacing with computer system 500. Another device that may be coupled to bus 511 is a wired/wireless communication capability 525.

Computer system 500 has a power supply 528 such as a battery, AC power plug connection and rectifier, etc.

Several embodiments of the invention have thus been described. However, those of ordinary skill in the art will recognize that the invention is not limited to the embodiments described, but can be practiced with modification and alteration within the scope and spirit of the appended claims that follow.

What is claimed is:

1. An apparatus, comprising:
an electronic component capable of generating heat;
an external wall;
an electromagnetic interference (EMI) shield to be positioned between the external wall and the electronic component; and
a louvered vent formed within the EMI shield, the louvered vent to create an air curtain between the EMI shield and the heat generating component when air is flowing, wherein the louvered vent is positioned in relation to the heat generating component to create the air curtain to deflect at least a portion of the heat from the heat generating component from reaching the EMI shield when air is flowing.

2. The apparatus of claim 1, wherein the heat generating component is a central processing unit (CPU), chipset, or memory.

3. The apparatus of claim 1, wherein the louvered vent draws air from outside of the EMI shield into the apparatus to form the air curtain.

4. The apparatus of claim 1, wherein the louvered vent extends from an inside surface of the EMI shield into the apparatus.

5. The apparatus of claim 1, wherein the EMI shield is to provide electromagnetic interference (EMI) protection for the apparatus.

6. The apparatus of claim 1, wherein the louvered vent is formed as a squared off chamber, a curved shape, or at an angle, the angle being in an approximate range between 15 degrees and 45 degrees with respect to the EMI shield.

7. The apparatus of claim 1, wherein the louvered vent is part of a row of louvered vents positioned to create an air curtain along the EMI shield.

8. A computing device, comprising:
   an electronic component capable of generating heat;
   a chip containing the electronic component;
   an electromagnetic interference (EMI) shield to be positioned between an external wall of the computing device and the electronic component; and
   a louvered vent formed within the EMI shield to create an air curtain between the EMI shield and the heat generating component when air is flowing, wherein the louvered vent is positioned in relation to the heat generating component to create the air curtain to deflect at least a portion of the heat from the heat generating component from reaching the EMI shield when air is flowing.

9. The device of claim 8, wherein the heat generating component is a central processing unit (CPU), chipset, or memory.

10. The device of claim 8, wherein the louvered vent draws air from outside of the EMI shield into the computing device to form the air curtain when air is flowing.

11. The device of claim 8, wherein the louvered vent extends from an inside surface of the EMI shield into the computing device.

12. The device of claim 8, wherein the EMI shield is to provide electromagnetic interference (EMI) protection for the computing device.

13. The device of claim 8, wherein the louvered vent is formed as a squared off chamber, a curved shape, or at an angle, the angle being in an approximate range between 15 degrees and 45 degrees with respect to the EMI shield.

14. The device of claim 8, wherein the louvered vent is part of a row of louvered vents positioned to create an air curtain along the EMI shield when air is flowing.

15. The device of claim 8, further comprising:
   a battery to power the computing device.

16. The device of claim 8, wherein the computing device has one or more openings for the flow of air, which are formed in the external wall.

17. The device of claim 8, further comprising:
   a wired/wireless communication logic coupled to the chip.

* * * * *